United States Patent
Kondo et al.

(10) Patent No.: US 7,368,172 B2
(45) Date of Patent: May 6, 2008

(54) MEMBRANE MULTI-LAYER STRUCTURE, AND ACTUATOR ELEMENT, CAPACITIVE ELEMENT AND FILTER ELEMENT USING THE SAME

(75) Inventors: Masao Kondo, Sagamihara (JP); Kazuaki Kurihara, Yamato (JP)

(73) Assignee: Fujitsu Limited, Kawasaki (JP)

( * ) Notice: Subject to any disclaimer, the term of this patent is extended or adjusted under 35 U.S.C. 154(b) by 347 days.

(21) Appl. No.: 10/832,428

(22) Filed: Apr. 27, 2004

(65) Prior Publication Data

US 2004/0253466 A1    Dec. 16, 2004

(30) Foreign Application Priority Data

Jun. 11, 2003   (JP)   ............... 2003-166569

(51) Int. Cl.
*B32B 9/06* (2006.01)
*B32B 9/00* (2006.01)

(52) U.S. Cl. ............... 428/446; 428/450; 428/701; 428/702

(58) Field of Classification Search ............... None
See application file for complete search history.

(56) References Cited

U.S. PATENT DOCUMENTS

| 5,753,934 | A | 5/1998 | Yano et al. |
| 6,258,459 | B1 | 7/2001 | Noguchi et al. |
| 6,747,317 | B2 * | 6/2004 | Kondo et al. ............... 257/347 |
| 2002/0015852 | A1 | 2/2002 | Noguchi et al. |

FOREIGN PATENT DOCUMENTS

JP    A1997-110592    4/1997

OTHER PUBLICATIONS

Office Action dated Apr. 7, 2006 issued in corresponding Chinese Application No. 2004 10047968.6.
Tarsa et al., "Common Themes in the Epitaxial Growth of Oxides on Semiconductors," Mat. Res. Soc. Sym. Proc. vol. 341, 1994, pp. 73-85.
Matsubara et al., "Preparation of Epitaxial $ABO_3$ Perovskite-type Oxide Thin Films on a $(100)MgAl_2O_4$/Si Substrate," J. Appl. Phys. vol. 66, 1989, pp. 5826-5832.

(Continued)

*Primary Examiner*—Jennifer C. McNeil
*Assistant Examiner*—Timothy M. Speer
(74) *Attorney, Agent, or Firm*—Westerman, Hattori, Daniels & Adrian, LLP (57) ABSTRACT

By performing epitaxial growth on a semiconductor substrate while keeping conformity, a membrane multi-layer structure showing increased polarization is provided.

A membrane multi-layer structure comprising a thin layer composed of zirconium oxide as the main component for allowing epitaxial growth, a thin layer having a simple perovskite structure, showing in-plane rotation by 45° of the (001) plane to the thin layer composed of zirconium oxide as the main component and performing epitaxial growth, and an intermediate layer provided between the thin layer composed of zirconium oxide as the main component and the thin layer having a simple perovskite structure.

20 Claims, 9 Drawing Sheets

OTHER PUBLICATIONS

Masuda et al., Preparation and Crystallographic Characterizations of Highly Oriented Pb($Zr_{0.52}Ti_{0.48}$)$O_3$ Films and MgO Buffer Layers on (100)GaAs and (100)Si by Pulsed Laser Ablation, Journal of Crystal Growth 158 (1996), pp. 84-88.

Hou et al., "Structure and Properties of Epitaxial $Ba_{0.5}Sr_{0.5}TiO_3$/$SrRuO_3$/$ZrO_2$ Heterostructure on Si Grown by Off-axis Sputtering," Appl. Phys. Lett. vol. 67, 1995, pp. 1387-1389.

* cited by examiner

(a) Fluorescent stone structure

Z=0        Z=1/4        Z=1/2        Z=3/4

(b) Rock salt structure

Z=0        Z=1/2

(c) Simple perovskite structure

Z=0        Z=1/2

Layer structure of each crystal

◍ : Cation A

● : Cation B

○ : Anion

MEMBRANE MULTI-LAYER STRUCTURE, AND ACTUATOR ELEMENT, CAPACITIVE ELEMENT AND FILTER ELEMENT USING THE SAME

CROSS-REFERENCE TO RELATED APPLICATIONS

This application claims priority to Japanese Patent Application No. JPA2003-166569 entitled "MEMBRANE MULTI-LAYER STRUCTURE, AND ACTUATOR ELEMENT, CAPACITIVE ELEMENT AND FILTER ELEMENT USING THE SAME" filed Jun. 11, 2003, which is entirely and specifically incorporated by reference.

BACKGROUND OF THE INVENTION

1. Field of the the Invention

The present invention relates to a membrane multi-layer structure which can be utilized as a non-volatile semiconductor memory and the like by providing a dielectric layer made of a ferroelectric on a semiconductor substrate, and a capacitive element, actuator element and filter element using the same.

2. Prior Art

Polarization of a ferroelectric layer is derived from a crystal of a substance, and when a ferroelectric layer of an oxide is utilized, a polarization property can be obtained by heating at several hundred degrees in the presence of oxygen to cause crystallization. For mounting this ferroelectric as a thin layer to obtain large polarization, an oxide single crystal layer having a uniform composition and having no defects is necessary.

However, in many cases, it is very difficult to obtain a single crystal layer, and usually, only a polycrystal is obtained. On the other hand, a polycrystal shows increase in leakage current due to presence of a defect of grain boundary and the like, and shows smaller polarization than that of a single crystal due to irregular orientation of crystal particles. Therefore, a layer not only oriented to the vertical direction to a base as standard but also oriented so as to have the same plane as the base plane, a so-called epitaxial layer, is preferable for obtaining large polarization.

Because of this, for allowing an epitaxial layer of a dielectric to grow, orientation of the surface of a single crystal semiconductor substrate such as a silicon substrate and the like is utilized. However, this silicon single crystal substrate is made of metal, and when exposed to an oxygen atmosphere at higher temperatures, the surface is easily oxidized to produce a silicon oxide layer ($SiO_2$). Since the silicon oxide layer is amorphous and has no orientation, it is difficult to allow an epitaxial layer of a dielectric to grow on this. Further, that reaction and diffusion between a ferroelectric layer to be grown and a silicon single crystal substrate are weak is also important for epitaxial grow of a ferroelectric layer. For example, The non-patent literature entitled "Mat. Res. Soc. Sym. Pro. Vol. 341" (1944, P. 73) discloses examples such as oxides of rare earth elements such as yttrium-stabilized zirconia (hereinafter, referred to as YSZ), cerium oxide and the like, magnesium oxide, magnesia spinel, strontium titanate and the like as the substance which can be epitaxial-grown on a silicon ingle crystal substrate.

For preventing a reaction of a silicon single crystal substrate and a simple perovskite oxide of a ferroelectric and formation of $SiO_2$ on the surface of a silicon single crystal substrate, it has been tried to form an intermediate layer made of yttria-stabilized zirconia (YSZ) formation of which epitaxial layer on a single crystal substrate had been reported, and magnesium oxide, magnesia spinel and the like, and to cause epitaxial growth of an oxide having a perovskite structure on the top of the intermediate layer. For example, regarding structures realizing the (001) epitaxial layer having a perovskite structure on the silicon (001) substrate, the non-patent literature entitled "J. Appl. Phys. Vol. 66" (1989,P. 5826) discloses an epitaxial structure of $SrTiO_3$ (001)/$MgAl_2O_4$ (001)/Si (001), and the non-patent literature entitled "J. Crystal Growth Vol. 158" (1996,P. 84) discloses an epitaxial structure of PZT (001)/MgO (001)/Si (001).

Further, a zirconium oxide layer is also supposed as an intermediate layer since it can epitaxial-grow on a silicon substrate. The Non-patent literature entitled "Appl. phys. Lett. Vol. 67" (1995,p. 1387) discloses that when a substance having a perovskite structure is formed on a zirconium oxide layer, a perovskite structure (001) plane grows in epitaxial relation to a zirconium oxide (001) plane.

However, since polarization of a ferroelectric having a simple perovskite structure has directionality, it is necessary to orient a ferroelectric to a coincident direction of a polarization direction and a direction of motion. For example, a non-volatile memory (FeRAM) using a ferroelectric having spontaneous polarization in a capacitor portion is expected to application to IC cards and the like as a memory of the next generation. In capacitor portions such as a non-volatile memory (FeRAM) and the like, a tetragonal ferroelectric perovskite oxide is usually used, and residual polarization direction of a tetragonal ferroelectric resides on the (001) plane. When a perovskite oxide on a zirconium oxide layer is oriented to the (011) plane, direction of residual polarization becomes inclined, and a high dielectric constant cannot be obtained, inviting decrease in dielectric property. This problem is a problem common not only to a non-volatile memory (FeRAM) but also to a capacitive element, actuator element and filter element.

JPA1997-110592 discloses that a laminated thin layer provided as an intermediate layer between a perovskite layer and a zirconium oxide layer to which a rare earth oxide such as $CeO_2$ and the like is added can give an epitaxial thin layer oriented to the (001) direction of an oxide having a simple perovskite structure. In this case, the lattice constant of zirconium oxide is 0.51 nm, the lattice constant of a typical simple perovskite oxide such as barium titanate and PZT and the like is about 0.39 nm, and the proportion of unconformity (here, represented by $(1-0.39/0.51) \times 100\%$) is 23%. The plane interval on the (011) plane of a simple perovskite oxide is $(2)^{1/2} \times 0.39$ nm≈0.55 nm, and the proportion of unconformity of crystal lattice is as small as −8%. It is supposed that by this, epitaxial growth is possible.

However, it is difficult to obtain a simple perovskite layer completely oriented to the (001) direction, and in many cases, orientation to the (011) direction remains and high dielectric constant cannot be obtained. Its crystalline property is also low, further, orientation is low, so polarizability cannot be increased. However, JPA1997-110592 describes that a barium titanate layer grows without causing in-plane rotation against a zirconium oxide layer, and three lattices of zirconium oxide (0.51 nm×3=1.53 nm) grow in conformity to four lattices of barium titanate (0.39 nm×4=1.56 nm). However, a grown layer including such large unconformity shows a tendency of concentration of stress on the interface and a tendency of peeling. Further, since conformity of lattices is not good, a crystalline property is also low. Moreover, JPA1997-110592 describes that a simple perovskite oxide grows without rotation at the (001) plane on a zirconium oxide layer, and it is difficult to obtain a layer of constitution in which conformed epitaxial growth is made by 45° in-plane rotation.

SUMMARY OF THE INVENTION

The present invention has been made in view of the above-mentioned problems, and an object thereof is to provide a membrane multi-layer structure having enhance polarization by making crystal orientation on a semiconductor substrate while keeping conformity with a grounding substrate.

A further object thereof is to provide a capacitive element having enhanced capacitance, an actuator element showing increased movement amount and action force by enhancing polarizability, and a filter element responding to a wider frequency region, by this crystal orientation while maintaining conformity with a grounding substrate.

For solving the above-mentioned problems, for example, the present invention provides the following means.

The first means is a membrane multi-layer structure having a plurality of thin layers on the (001) plane of a semiconductor substrate, wherein the above-mentioned membrane multi-layer structure comprises a thin layer composed of zirconium oxide as the main component for allowing epitaxial growth and a thin layer having a simple perovskite structure, showing in-plane rotation by 45° of the (001) plane to the thin layer composed of zirconium oxide as the main component and performing epitaxial growth.

The second means preferably has a constitution comprising an intermediate layer provided between the thin layer composed of zirconium oxide as the main component and the thin layer having a simple perovskite structure, in the first means.

In the above-mentioned first or second means, the above-mentioned semiconductor substrate may be made of silicon. Alternatively, in the above-mentioned first or second means, the above-mentioned thin layer composed of zirconium oxide as the main component may be made of an alkaline earth metal or light rare earth metal including Y, Sc. Further, in the above-mentioned first or second means, a metal layer containing platinums may be allowed to perform epitaxial growth to be provided on the thin layer having a simple perovskite structure, in the above-mentioned membrane multi-layer structure.

The third means preferably has a lattice constant of the above-mentioned intermediate layer in the range from 65 to 75% based on the lattice constant of the thin layer having a simple perovskite structure.

In the above-mentioned first, second or third means, the above-mentioned dielectric layer may have a plurality of thin layers having a simple perovskite structure in which at least one layer is a thin layer showing epitaxial growth on the layer composed of zirconium oxide as the main component and having a piezoelectric effect or electrostriction effect.

The fourth means may be constituted as an actuator element having a dielectric layer provided on a metal substrate, wherein the above-mentioned dielectric layer comprises a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane.

Further, the fifth means may be constituted as a capacitive element having a dielectric layer provided on a metal substrate, wherein the above-mentioned dielectric layer is composed of a dielectric layer comprising a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane.

Furthermore, the fifth means may be constituted as a filter element having a dielectric layer provided on a metal substrate, wherein the above-mentioned dielectric layer is composed of a membrane multi-layer structure comprising a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane.

BRIEF DESCRIPTION OF THE DRAWINGS

FIG. 3(a) shows a fluorescent stone structure of zirconium oxide, FIG. 3(b) shows a rock salt structure of strontium oxide and FIG. 3(c) shows a structure of simple perovskite.

FIG. 5(a) is an X ray diffraction diagram observing a crystal plane of each thin layer when an intermediate layer is provided and FIG. 5(b) is an X ray diffraction diagram observing a crystal plane of each thin layer when an intermediate layer is not provided.

FIG. 8(a) is a sectional view and FIG. 8(b) is a plan view.

DETAILED DESCRIPTION OF THE PREFERRED EMBODIMENTS

Hereinafter, Preferred embodiments of the present invention will be explained with reference to the drawings.

Figure 1:
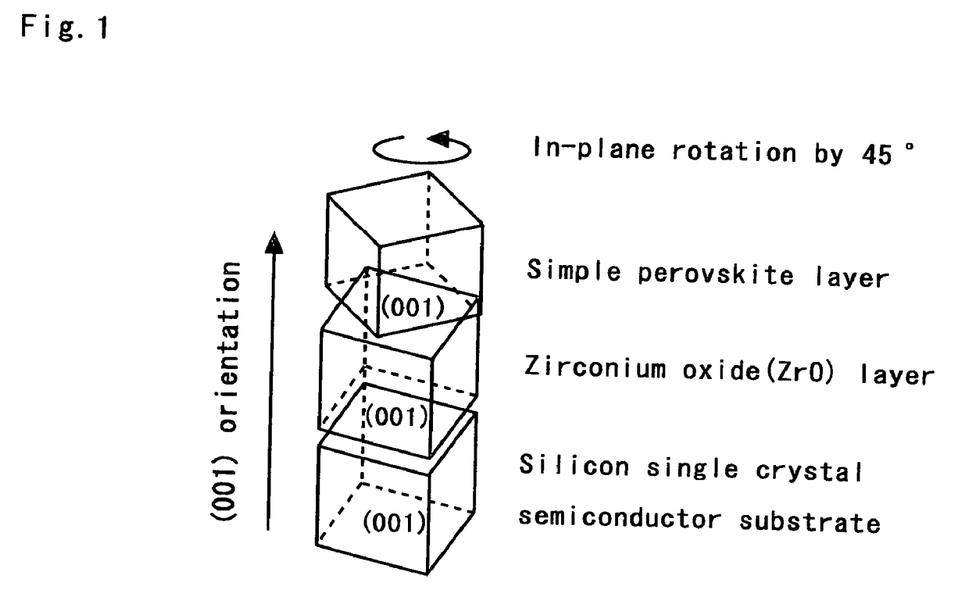
FIG. 1 is a schematic constitutional view showing a layer structure of a membrane multi-layer structure, one embodiment of the present invention.

FIG. 1 is a schematic constitutional view showing a layer structure of a membrane multi-layer structure, one embodiment of the present invention. The membrane multi-layer structure according to the present invention comprises a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane.

Figure 2:
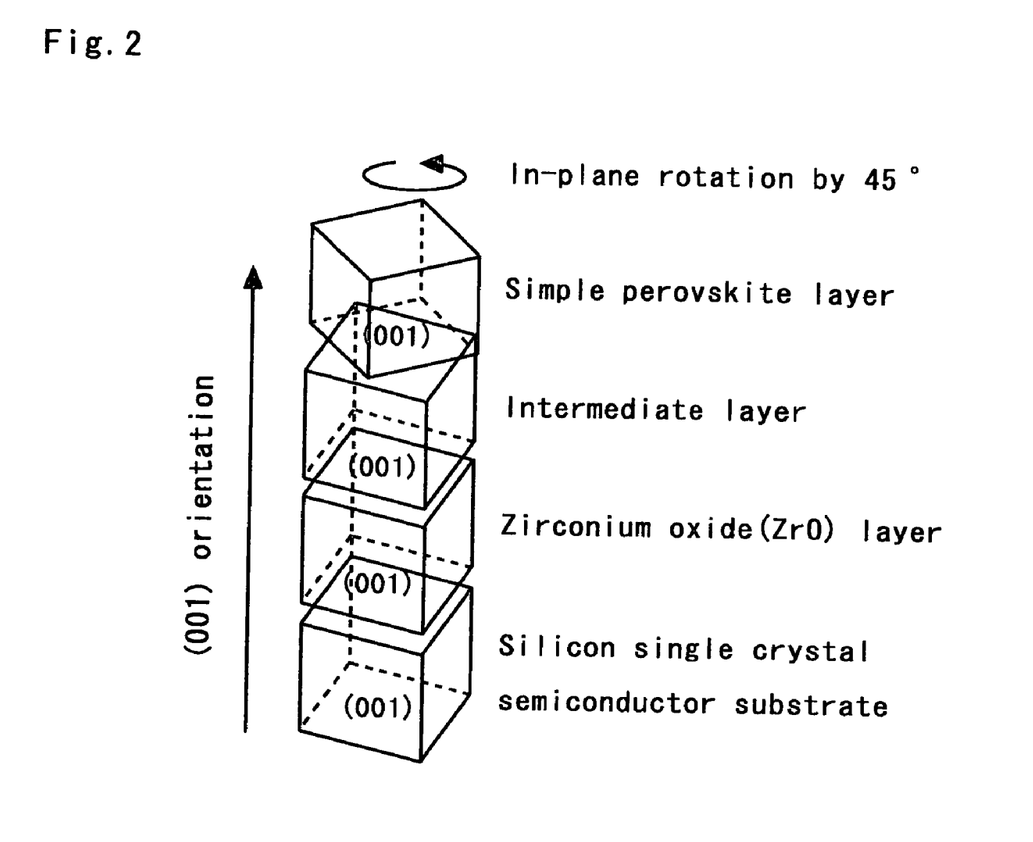
FIG. 2 is a schematic constitutional view showing a layer structure of a membrane multi-layer structure, another embodiment of the present invention.

FIG. 2 is a schematic constitutional view showing a layer structure of a membrane multi-layer structure, another embodiment of the present invention. The membrane multi-layer structure according to the present invention comprises a thin layer composed of zirconium oxide as the main component for allowing epitaxial growth on the (001) plane of a semiconductor substrate, a thin layer having a simple perovskite structure, performing epitaxial growth and showing in-plane rotation by 45° of the (001) plane, and an intermediate layer provided between the thin layer composed of zirconium oxide as the main component and the thin layer having a simple perovskite structure.

As the semiconductor substrate, single crystals of metals such as silicon (Si), gallium.arsenic (GaAs) and the like are used. As this semiconductor substrate, silicon is preferable. Silicon is made of a cheap low material, widely used, and can be utilized easily in various elements.

On this silicon single crystal substrate, a thin layer composed of zirconium oxide (ZrO) as the main component (hereinafter, referred to as "ZrO layer" unless otherwise stated) is provided, and provided on this ZrO layer an intermediate layer obtained by epitaxial growth and a thin layer having a simple perovskite structure (hereinafter, referred to as "simple perovskite layer" unless otherwise stated) prepared by epitaxial growth. As shown in FIGS. 1 and 2, the (001) plane of the simple perovskite layer is oriented at the (001) plane against the (001) plane of a ZrO layer, further, the simple perovskite layer has a laminated structure having the same orientation of the (001) plane for the silicon single crystal substrate and ZrO layer and showing in-plane rotation by 45° in the (001) plane.

Figure 3:
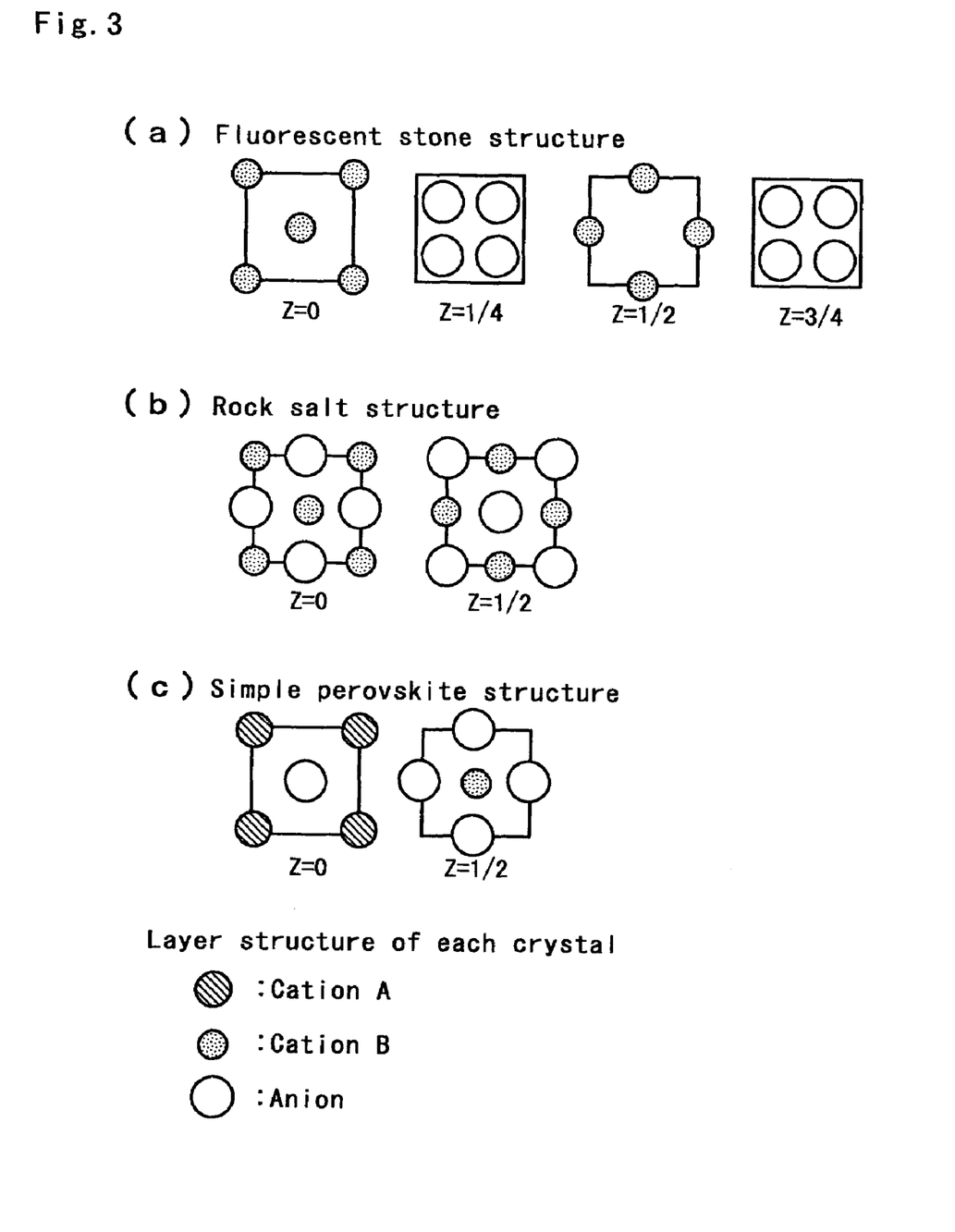
FIG. 3 shows a layer structure of crystal of each thin layer structure.

Further, as shown in FIG. 2, a layer having a rock salt structure is provided as an intermediate layer. The rock salt structure also has a cubic structure as the ZrO layer and simple perovskite layer. FIG. 3 shows a layer structure of crystal of each thin layer structure, and FIG. 3(a) shows a fluorescent stone structure of zirconium oxide, FIG. 3(b) shows a rock salt structure of an intermediate layer, strontium oxide and FIG. 3(c) shows a simple perovskite structure.

Figure 4:
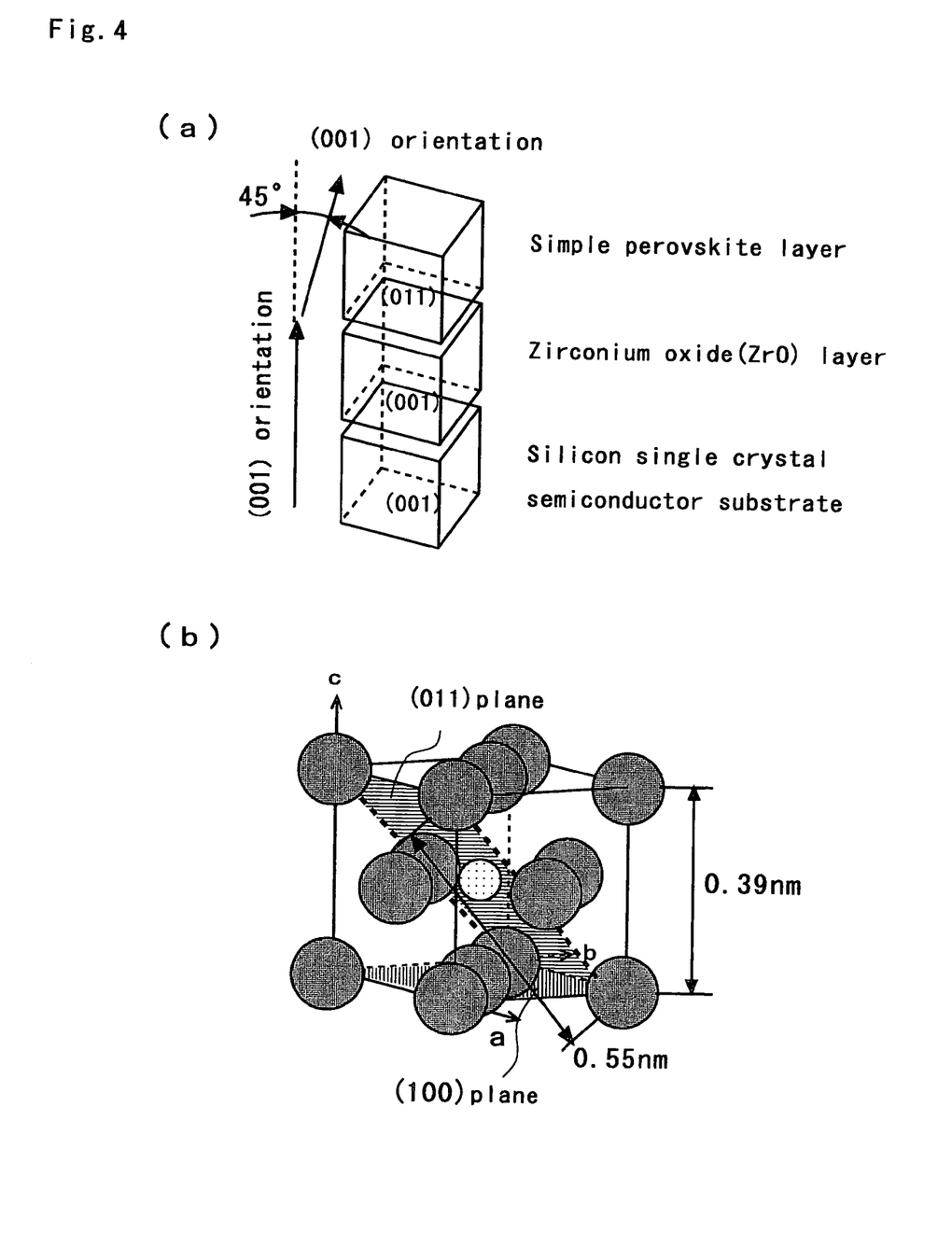
FIG. 4 is a schematic constitutional view showing a layer structure of a membrane multi-layer structure formed by growth of the simple perovskite (011) plane and the zirconium oxide (001) plane in an epitaxial relation.

As described in conventional technologies, the lattice constant of a simple perovskite layer shows a large difference from the lattice constant of a ZrO layer, namely, shows small conformity, therefore, FIG. 4 is a schematic constitutional view showing a layer structure of a membrane multi-layer structure formed by growth of the simple perovskite (011) plane and the ZrO (001) plane in an epitaxial relation. As shown in FIG. 4(a), a simple perovskite layer inclines by 45° against a ZrO layer, and the (001) plane of a ZrO layer and the (011) plane of a simple perovskite layer grow while keeping an epitaxial relation of them. In this case, the lattice constant of ZrO is 0.51 nm and both of them are in the form of cubic crystal, however, though in the same cubic crystal, a typical simple perovskite such as barium titanate, PZT and the like has a lattice constant of 0.39 nm and has an inter-lattice distance of the (011) plane of $2^{1/2} \times 0.39$ nm=0.55 nm close to a lattice constant of ZrO of 0.51 nm, and a difference in unconformity decreases. As shown in FIG. 4(b), growth is effected while keeping an epitaxial relation with the (011) plane inclined by 45° not with the (001) plane of a simple perovskite layer. However, residual polarization of a simple perovskite layer is on the (001) plane, and this (001) plane inclines against the vertical direction which is a motion direction of a silicon single crystal substrate, and consequently, polarizability decreases, further, high voltage and delay time for response are required for polarization, as a result, a dielectric property when used as a membrane multi-layer structure lowers.

In the present invention, as shown in FIG. 2, an intermediate layer is provided to allow a simple perovskite layer to have an epitaxial relation while keeping arrangement of the (001) plane. For epitaxial growth, conformity of a lower part layer with an upper part layer showing epitaxial growth is important.

For decreasing conformity by decreasing a difference in the lattice constant of an intermediate layer epitaxial-grown from a ZrO layer and inter-lattice distance on the diagonal in the (001) plane of a simple perovskite layer (hereinafter, described simply as "inter-lattice distance"), in-plane rotation by 45° in the (001) plane is effected while maintaining the arrangement of the (001) plane, to decrease a difference in unconformity by the inter-lattice distance. In this case, unconformity can be represented by a difference in the lattice constant of an intermediate layer and the inter-lattice distance of the (001) plane of simple perovskite.

Here, as described above, a difference when in-plane rotation by 45° is not conducted of 23% changes to a difference when in-plane rotation by 45° is conducted of −8% like in the case of inclination of a plane by 45°, namely, the difference is larger in the case of simple perovskite, however, it is not so large difference as to disturb epitaxial growth. Accordingly, in view that a difference of corresponding atoms is at least 8% or less and epitaxial growth is performed while effecting in-plane rotation by 45°, it is necessary that the lattice constant or inter-lattice distance is in the range from 92% to 108% and it is preferable that the lattice constant of an intermediate layer is in the range from 65 to 75% based on the lattice constant of a simple perovskite layer.

Further, in addition to this, arrangement of atoms should be taken into consideration. In the present invention, this intermediate layer does not disturb an epitaxial relation adjacent layers on both sides, and a simple perovskite does not disturb an epitaxial relation with a ZrO layer, and a simple perovskite layer can be epitaxial-grown.

Alternatively, as shown in FIG. 3(a), in the fluorescent structure of zirconium oxide, a cation is present at the corner of the (001) plane, and as shown in FIG. 3(b), in the rock salt structure of an intermediate layer, a cation is present at the corner and an anion is present at the center of the edge of crystal lattice. Here, as an example of a rock salt structure, strontium oxide (hereinafter, referred to as "SrO") has a lattice constant of 0.52 nm. As shown in FIG. 3(c), in the crystal structure of a simple perovskite layer, a cation is present at the corner of the (001) plane.

A ZrO layer and an intermediate layer, SrO layer have approximately the same lattice constant, and a ZrO layer and an intermediate layer of SrO manifest epitaxial growth irrespective of the arrangement of the same cation. However, if a SrO layer and a simple perovskite layer are hypothesized to be the same as the above-mentioned ZrO layer and simple perovskite layer, lattice constant is different, and consequently, a simple perovskite layer cannot perform epitaxial growth on the (001) plane. However, when an anion is present in the (001) plane in the crystal structure of a SrO layer, attraction occurs with this. Therefore, by the fact that a difference in lattice constant or inter-lattice distance is in the range from 65 to 75% and ion force acts, stable presence is possible while maintaining an epitaxial relation of the (001) plane even if in-plane rotation by 45° occurs.

Thus, in the membrane multi-layer structure of the present invention, as a result of formation of various substances between the (001) plane of a silicon semiconductor substrate carrying an epitaxial layer composed of ZrO as the main component formed thereon and an oxide having a simple perovskite structure, an intermediate layer having a rock salt structure is formed and, on this, a layer having a simple perovskite structure is formed, thus, each layer can manifest epitaxial growth so as to cause arrangement completely to the direction of the (001) plane and a layer having a simple perovskite structure showing a very high crystalline property can be formed.

Figure 5:
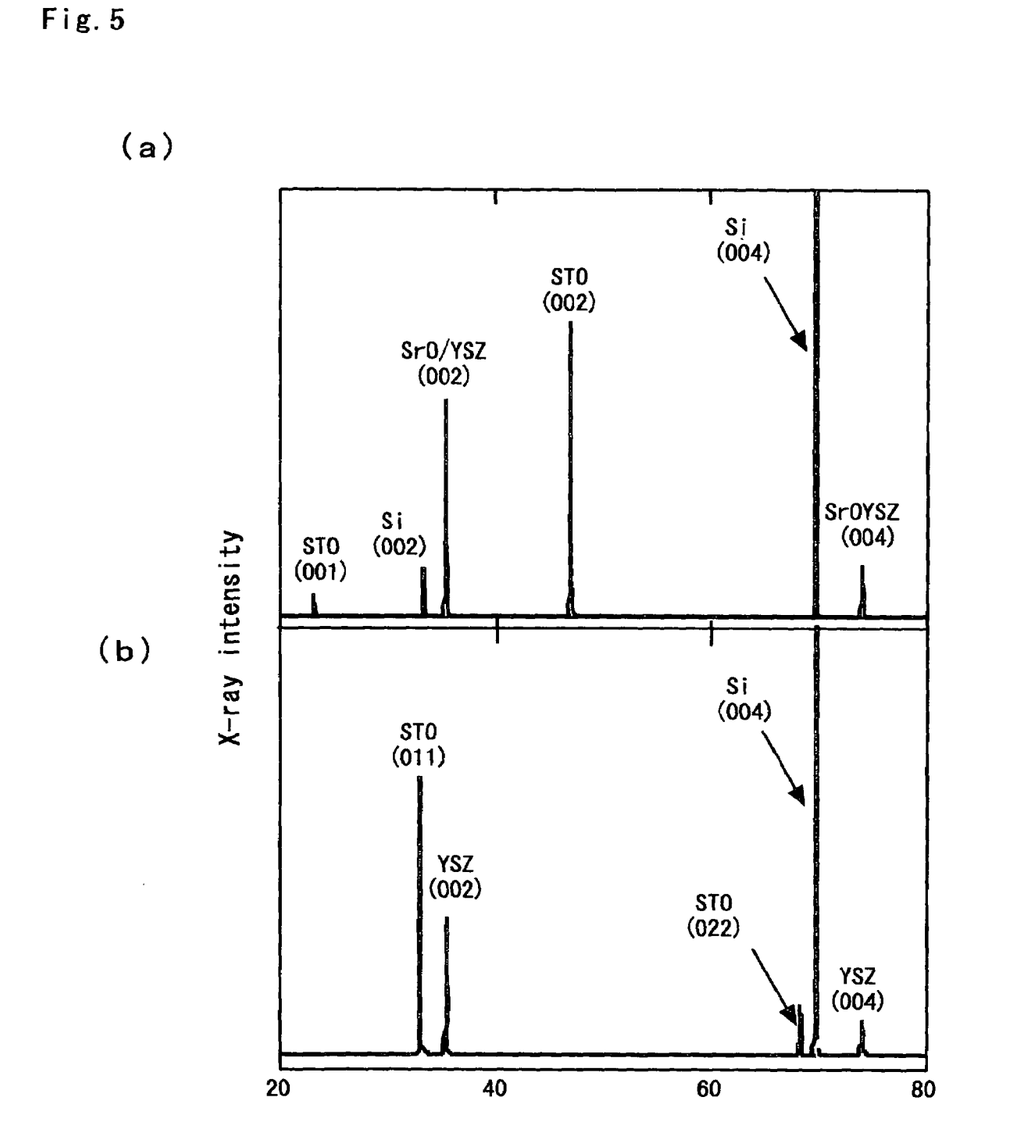
FIG. 5 is a view showing the orientation ratio of the (001) plane of a simple perovskite layer depending on the presence or absence of an intermediate layer.

Here, FIG. 5 is a view showing the orientation ratio of the (001) plane of a simple perovskite layer depending on the presence or absence of an intermediate layer, and FIG. 5($a$) is an X ray diffraction diagram observing a crystal plane of each thin layer when an intermediate layer is provided and FIG. 5($b$) is an X ray diffraction diagram observing a crystal plane of each thin layer when an intermediate layer is not provided. In FIG. 5, Si represents a silicon single crystal substrate, STO represents strontium titanate having a simple perovskite structure, YSZ represents zirconia oxide stabilized by addition of Y (hereinafter, described simply as "YSZ"), and SrO represents strontium oxide as an intermediate layer.

As shown in FIG. 5($b$), when laminated without providing an intermediate layer, the (001) plane of strontium titanate is not observed, teaching that arrangement on the (011) plane is dominant. In contrast, in FIG. 5($a$), an intermediate layer composed of SrO having a thickness of 1.5 nm is provided. Here, it is observed that SrO/YSZ is also arranged on (001), and STO of a simple perovskite layer is almost arranged on the (001) plane, including no orientation to the (011) plane. Thus, by providing an intermediate layer having a rock salt structure on a YSZ layer, an STO layer of a simple perovskite layer formed on this can be arranged on the (001) plane.

As the intermediate layer, a rock salt structure containing a cation at the corner of the (001) surface and an anion on the edge is preferable, specifically, at least one oxide selected from the group consisting of magnesium oxide, calcium oxide, barium oxide and strontium oxide is mentioned, further, SrO having lattice constant close to that of YSZ is more preferable.

In the membrane multi-layer structure shown in FIG. 1, a SrO initial layer having a rock salt structure is formed with large thickness. It is a schematic constitutional view showing the layer structure of the membrane multi-layer structure shown in FIG. 2, showing a condition in which most of an intermediate layer disappears. By forming SrO having a rock salt structure with extremely small thickness, SrO is thermally diffused in a formed layer of a simple perovskite oxide formed immediately thereon, thus, a multi-layer can be obtained in which an epitaxial layer having a perovskite structure of the direct (001) orientation is formed on the YSZ epitaxial layer as shown in FIG. 2. In this case, the intermediate layer before thermal diffusion may sufficiently be a very thin layer of 1 mm or less since an influence by the most adjacent atom is most large on the arrangement of elements. Additionally, after once arranged, even if they are diffused to disappear by thermal treatment at high temperatures within the range in which modification of crystal does not occur, the initial crystal structure of a simple perovskite layer can be maintained since the amount thereof is small.

As described above, by allowing the arrangement of the (001) plane of a simple perovskite layer to coincide with that of a ZrO layer and silicon semiconductor substrate, polarizability can be enhanced and further, when acted as a membrane multi-layer structure, response time can be shortened at low voltage.

It is preferable that a ZrO layer contains alkaline earth metals or light rare earth metals including Y, Sc. Pure zirconium oxide is tetragonal at high temperatures and monoclinic at room temperature, and manifests phase transition in cooling. Since change in volume in this phase transition is very large, a well closely adhered layer is not obtained easily. By addition of alkaline earth metals or light rare earth metals including Y, Sc, the temperature for phase transition lowers to give stabilization. Therefore, it is preferable to use this stabilized tetragonal ZrO layer. Regarding the addition amount, for example, the atomic ratio Z/Y of Zr to Y in yttrium-stabilized zirconia (YSZ) to which Y has been added is preferably from 0.3 to 3.0.

A significant proportion of oxides having this simple perovskite structure are ferroelectrics, and materials having a piezoelectric property, dielectric property, pyroelectric property, semiconductivity, electric conductivity and electro-optic effect are mentioned. These materials can be appropriately used in the form of membrane multi-layer structure. The simple perovskite may also be that containing Mg and Ca in the form of divalent metal element, in addition to $SrTiO_3$, $BaSrTiO_3$, $(Ba, Sr)TiO_3$, $SrTiO_3$, $(Pb, La)(Zr, Ti)O_3$, $Pb(Zr, Ti)O_3$, $PbTiO_3$. Further, the simple perovskite may also be that containing Ag, Al, Ba, Bi, Ca, Ce, Cd, Co, Cu, Dy, Eu, Fe, Ga, Gd, Hf, Ir, In, La, Sb, Sc, Sm, Sn, Sr, Ta, Te, Th, Tl, U, V, W, Y, Yb, Zr and the like. These are not limited to the stoichiometrical composition, and for example, in $SrTiO_3$, the atomic ratio of Sr/Ti is preferably in the range from 0.7 to 1.3. Regarding oxygen O, it is preferably in the range from 2.7 to 3.3, around the center of 3. Providing this simple perovskite structure is maintained, the atomic ratio can be appropriately selected depending on a dielectric property.

Particularly, of them, as the substance having a simple perovskite structure, at least one oxide selected from the group consisting of $SrRuO_3$, $CaRuO_3$, $LaNiO_3$, $(La_xSi_{1-x})CoO_3$ (wherein, $0<x<1$), $CaTiO_3$, $(Ba_xSr_{1-x})TiO_3$ (wherein, $0<x<1$) can be used. These can be used, for example, in non-volatile memories using a ferroelectric (FeRAM). By utilizing a hysteresis effect of a ferroelectric, a non-volatile memory is obtained, and by forming a layer having high conformity with a ferroelectric material showing large residual polarization, a membrane multi-layer structure having strong layer fatigue resistance against repeated use can be obtained. Further, since relative dielectric constant is high, it can be used in the form of layer condenser in capacitive elements. It has a structure in which a lower part electrode, dielectric layer and upper part electrode are laminated on a substrate in this order, and a semiconductor substrate having a function as a lower part electrode can be used as it is. Regarding the capacitive element, by using a material in which a dielectric layer has large relative dielectric constant tan δ (dielectric loss) a capacitive element of large capacity can be obtained.

In the membrane multi-layer structure of the present invention, at least one of dielectric layers has a piezoelectric effect or electrostriction effect. The piezoelectric effect means a phenomenon that polarization occurs when outer force is applied, and the electrostriction effect means a phenomenon in which dielectric polarization occurs when electric field is applied and resultantly strain occurs. As this material having a piezoelectric effect, electrostriction effect, at least one or more oxides selected from the group consisting of $Pb(Zr_{1-x}Ti_x)O_3$ ($0<x<1$), $(Pb_{1-y}La_y)(Zr_{1-x}Ti_x)O_3$ ($0<x, y<1$) $Pb(B'_{0.33}B''_{0.57})_xTi_yZr_{1-x-y}O_3$ ($0<x, y<1$, B' represents a divalent transition metal and B" represents a penta-valent transition metal), $Pb(B'_{0.5}B''_{0.5})_xTi_yZr_{1-x-y}O_3$ ($0<x$, $y<1$, B' represents a tri-valent transition metal and B" represents a penta-valent transition metal) and $Pb(B'_{0.33}B''_{0.67})_xTi_yZr_{1-x-y}O_3$ ($0<x$, $y<1$, B' represents a hexa-valent transition metal and B" represents a tri-valent transition metal) are listed. For example, by a fact that a piezoelectric effect is large, an extremely thin actuator element sensing small change and excellent in responsiveness can be obtained.

Further, in addition to a thin layer having a simple perovskite structure, a thin layer having a tungsten bronze structure may be provided. In the thin layer having a tungsten bronze structure, at least one oxide selected from the group consisting of $(Sr_xBa_{1-x})Nb_2O_6$ (wherein, $0<x<1$), $(Sr_{1-x}Ba_x)Ta_2O_6$ (wherein, $0<x<1$), $PbNb_2O_6$, $Ba_2NaNb_5O_{15}$, $(Ba_xSr_{1-x})TiO_3$ (wherein, $0<x<1$) can be used. Since a perovskite layer tends to epitaxial-grow on these perovskite layers, these layers may have a multi-layer structure. These are not limited to the stoichiometrical composition, and the composition can be appropriately selected in the range showing a dielectric property.

In general, most of the tungsten bronze structures are based on a structure in which a part of cation sites in a simple perovskite structure is lacking. Therefore, ferroelectricity is obtained by fluctuation of oxygen forming octahedron, further, in the point of an epitaxial relation, it can be supposed to be the same as a simple perovskite structure.

In addition to the thin layer having a simple perovskite structure, a thin layer having a bismuth layer structure may also be provided. As the thin layer having a bismuth layer structure, at least one oxide selected from the group consisting of $(Bi_{1-x}R_x)_4Ti_3O_{12}$ (wherein, R represents a light rare earth metal including Y and Sc, $0<x<1$), $SrBi_2Ta_2O_9$ and $SrBi_4Ti_4O_{15}$. The bismuth layer structure is a crystal structure represented by $(Bi_2O_2)^2(A_{m-1}B_mO_{3m+1})^2$, and a plurality of perovskite structures are sandwiched between $(Bi^?O_2)^2$ layers. Also these can epitaxial-grow by an intermediate layer in the same manner as for a simple perovskite structure. These layers may be made into a multi-layer structure since a perovskite layer tends to epitaxial-grow on a perovskite layer. Ferroelectricity is obtained by fluctuation of oxygen forming octahedron having this bismuth layer structure. By using $(Bi_{1-x}R_x)_4Ti_3O_{12}$ and the like, a membrane multi-layer structure can be obtained. These are not limited to the stoichiometrical composition, and the composition can be appropriately selected in the range showing a dielectric property.

This membrane multi-layer structure is provided by epitaxial-growing a metal layer containing a platinum group metal on a simple perovskite layer. In the membrane multi-layer structure, a layer made of a platinum group metal such as platinum and iridium capable of epitaxial-growing may be formed on STO.

Further, after formation of a multi-layer structure, annealing of heating by raising temperature higher than the layer formation temperature may be conducted in oxygen for improving a crystalline property of the layer. In this case, since oxygen permeates through the layer to enter into a substrate, a silicon thermal oxidation layer is formed between a layer having a rock salt structure and a substrate. Since epitaxial-growing has been already completed, even if this new silicon thermal oxidation layer is formed, there is no influence exerted on the structure of other thin layer.

Hereinafter, embodiments of the present invention will be explained in more detail. By providing a layer laminated structure comprising a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane, an actuator element can be obtained. In this procedure, an electrode is provided on either one or both of the semiconductor substrate and simple perovskite. An example thereof will be illustrated below.

EMBODIMENT 1

Figure 6:
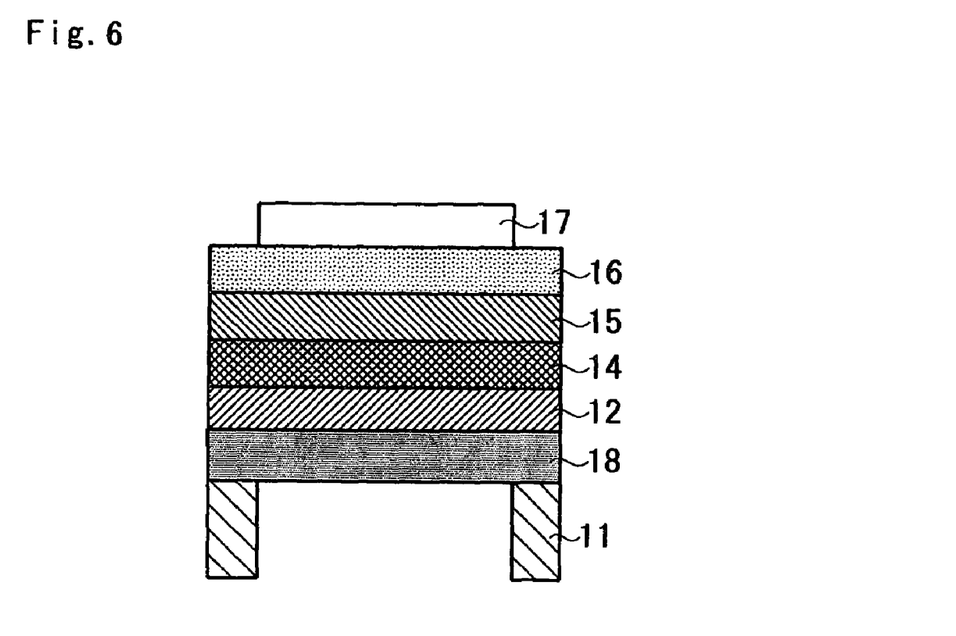
FIG. 6 is a schematic view showing a layer constitution of an actuator element obtained in Embodiment 1.

A specific method of producing the actuator element of the present invention will be illustrated below. FIG. 6 is a schematic view showing the layer structure of an actuator element obtained in Embodiment 1.

First, a 2-inch silicon single crystal substrate having a (001) direction is washed, then, immersed in 9% dilute hydrofluoric acid to remove a $SiO_2$ layer on the surface of the substrate. This silicon single crystal substrate is set in a layer formation chamber, and kept at 800° C. An yttrium-stabilized zirconia target (hereinafter, referred to as "YSZ target") is irradiated with KrF excimer laser under a pressure of $5\times10^{-4}$ Torr for 7 minutes while flowing oxygen of 12 sccm, and a YSZ layer is allowed to epitaxial-grow by a pulse laser vapor deposition method.

Next, the layer is heated at 1000° C. for 2 hours while flowing oxygen at 5 L/minute under atmospheric pressure in an infrared furnace and a silicon thermal oxidation layer is formed between YSZ and silicon substrate, to improve the crystalline property of the YSZ layer.

Next, the layer is returned into the chamber again, the target is changed to a strontium carbonate target heated at 1000° C. for 2 hours while flowing oxygen under atmospheric pressure, and the layer is kept at 800° C. under a pressure of 10 mTorr while flowing oxygen of 6 sccm, and irradiated with laser for 2 minutes, to allow a strontium oxide layer to epitaxial-grow on the YSZ layer.

Then, the target is changed to strontium titanate, the layer is irradiated with laser for 10 minutes under a pressure of 10 mTorr while flowing oxygen of 6 sccm, to allow a strontium titanate layer to epitaxial-grow on the SrO/YSZ layer.

After cooling, the substrate is removed from the chamber. The substrate is placed into a chamber of a sputtering apparatus and kept at 600° C., and platinum is sputtered for 20 minutes while flowing argon of 30 sccm and oxygen of 1 sccm, to form an epitaxial layer of platinum.

After cooling, the substrate is removed from the chamber. 0.3 cc of PLZT sol gel liquid (composition: PLZT 113/3/45/55) is dropped and rotated by a spin coater. The substrate is placed on a hot plate which has been heated to 350° C. previously to evaporate the solvent, and cooled to room temperature. This operation is repeated three times to completely remove the solvent.

Then, the substrate is heated at 65° C. for 10 minutes under atmospheric pressure while flowing oxygen at 5 L/minute, to crystallize the PLZT layer. A metal mask is placed on the substrate, and a platinum layer in the form of circle is formed on this by a sputtering method.

Then, a resist resin is applied on the bottom and patterned, and an opening is made with given size. Then, the substrate is immersed in a saturated KrOH solution of 80° C. and the silicon substrate is subjected to anisotropic etching, to give a diaphragm structure.

Further, the substrate is heated at 600° C. for 60 minutes while flowing oxygen at 5 L/minute under atmospheric pressure, to effect recover annealing of the PLZT layer.

An actuator element is obtained as described above.

Further, by providing a dielectric layer comprising a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane, a capacitive element can be obtained. In this procedure, an electrode is provided on either one or both of the semiconductor substrate and simple perovskite. An example thereof will be illustrated below.

EMBODIMENT 2

Figure 7:
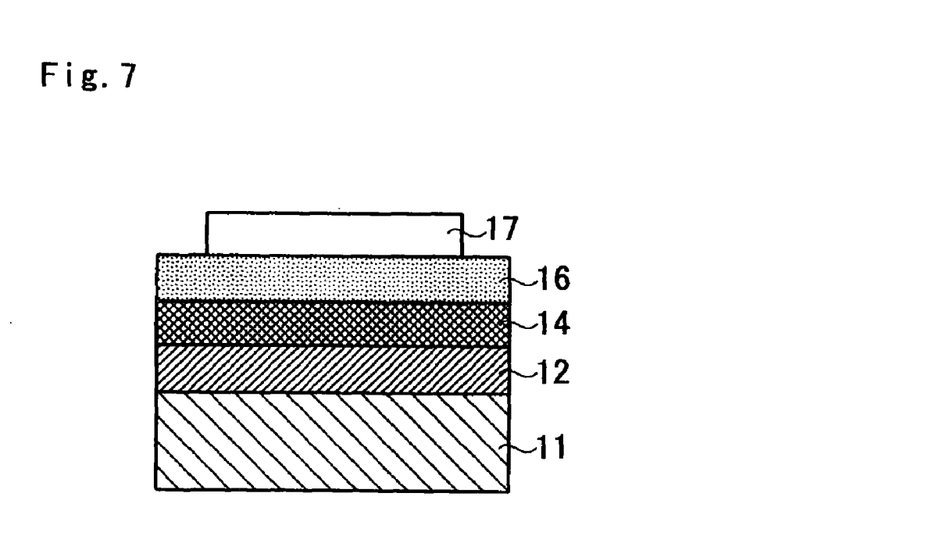
FIG. 7 is a schematic view showing a layer constitution of a capacitive element obtained in Embodiment 2.

A specific method of producing the capacitive element of the present invention will be illustrated below. FIG. 7 is a schematic view showing the layer structure of a capacitive element obtained in Embodiment 2.

First, a 2-inch silicon single crystal substrate having a (001) direction is washed, then, immersed in 9% dilute hydrofluoric acid to remove a $SiO_2$ layer on the surface of the substrate. This silicon single crystal substrate is set in a layer formation chamber, and kept at 800° C. An yttrium-stabilized zirconia target (hereinafter, referred to as "YSZ target") is irradiated with KrF excimer laser under a pressure of $5 \times 10^{-4}$ Torr for 7 minutes while flowing oxygen of 12 sccm, and a YSZ layer is allowed to epitaxial-grow by a pulse laser vapor deposition method. The layer is heated at 1000° C. for 2 hours while flowing oxygen at 5 L/minute under atmospheric pressure in an infrared furnace and a silicon thermal oxidation layer is formed between YSZ and silicon substrate, to improve the crystalline property of the YSZ layer.

Next, the layer is returned into the chamber again, the target is changed to a strontium carbonate target heated at 1000° C. for 2 hours while flowing oxygen under atmospheric pressure, and the layer is kept at 800° C. under a pressure of 10 mTorr while flowing oxygen of 6 sccm, and irradiated with laser for 2 minutes, to allow a strontium oxide layer to epitaxial-grow on the YSZ layer.

The target is changed to $SrRuO_3$, the layer is irradiated with laser for 10 minutes under a pressure of 10 mTorr while flowing oxygen of 6 sccm, to allow a strontium ruthenate layer to epitaxial-grow on the SrO/YSZ layer to the (001) direction.

Then, target is changed to PZT52/48, and the layer is irradiated with laser for 10 minutes under a pressure of 200 mTorr while flowing oxygen of 6 sccm, to allow a PZT layer to epitaxial-grow on the $SrRuO_3$/SrO/YSZ layer.

Thereafter, a metal mask is placed on the substrate, and a platinum layer in the form of circle is formed on this by a sputtering method. The substrate is heated at 600° C. for 60 minutes while flowing oxygen at 5 mL/minute under atmospheric pressure, to effect recover annealing of the PLZT layer.

An actuator element is obtained as described above.

Further, by providing a dielectric layer comprising a thin layer composed of zirconium oxide as the main component for allowing epitaxial growth on the (001) plane of a semiconductor substrate and a thin layer having a simple perovskite structure, performing epitaxial growth and showing in-plane rotation by 45° of the (001) plane, a filter element can be obtained. In this procedure, an electrode is provided on either one or both of the semiconductor substrate and simple perovskite.

For use as an SAW filer element, it is necessary to form a layer having a piezoelectric property. As the layer having a piezoelectric property, a piezoelectric layer may be directly formed on an intermediate layer having a rock salt structure, or a piezoelectric layer may be formed on an insulation layer having a simple perovskite structure, for example, an STO layer and the like. By forming an upper part electrode in the form of comb on the resulted piezoelectric layer, an SAW filter is obtained. An example thereof will be illustrated below.

EMBODIMENT 3

Figure 8:
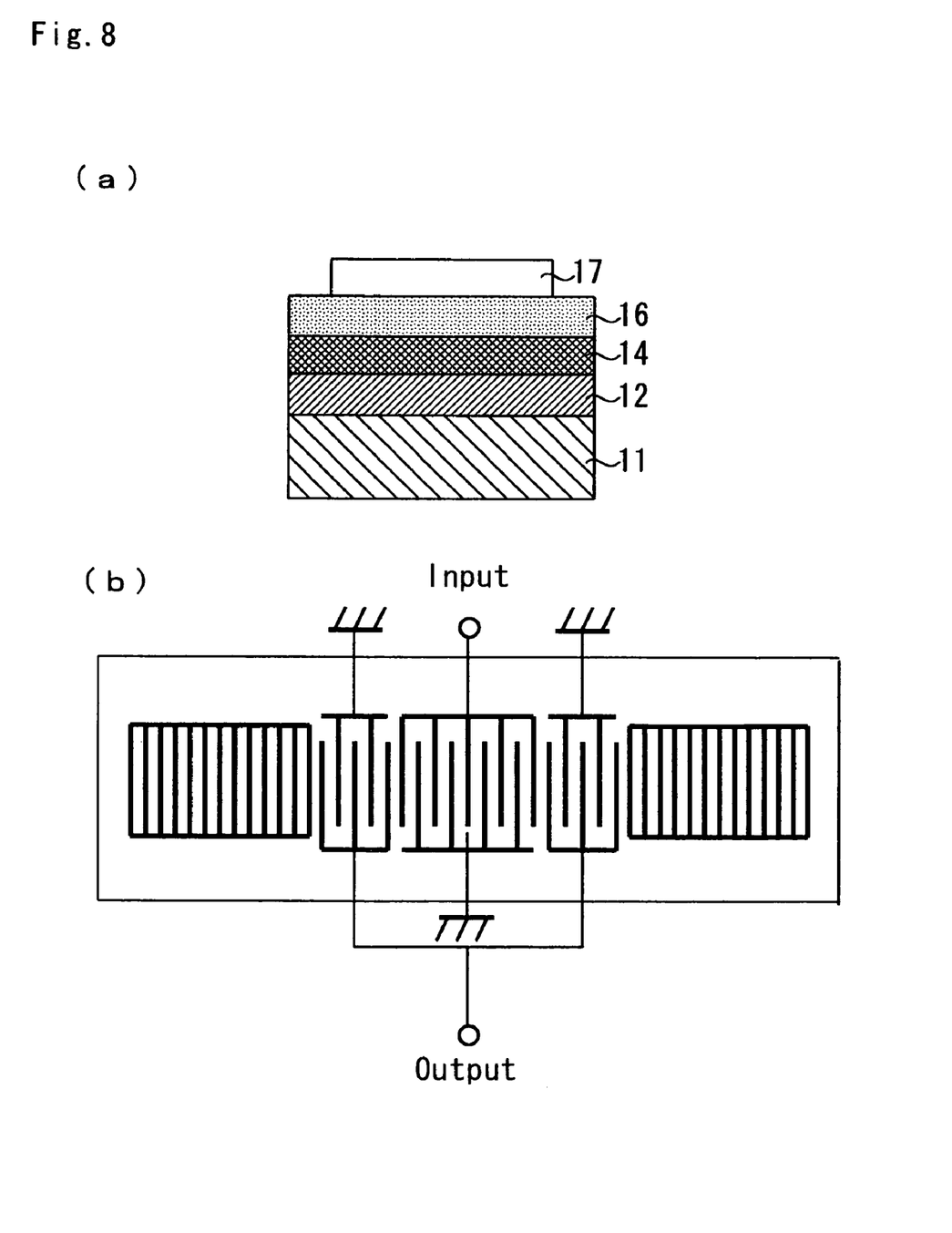
FIG. 8 is a schematic view showing a layer constitution of a filter element obtained in Embodiment 3.

FIG. 8 is a schematic view showing a layer constitution of a filter element obtained in Embodiment 3, and FIG. 8(a) is a sectional view and FIG. 8(b) is a plan view.

First, a 2-inch silicon single crystal substrate having a (001) direction is washed, then, immersed in 9% dilute hydrofluoric acid to remove a $SiO_2$ layer on the surface of the substrate. This silicon single crystal substrate is set in a layer formation chamber, and kept at 800° C. An yttrium-stabilized zirconia target (hereinafter, referred to as "YSZ target") is irradiated with KrF excimer laser under a pressure of $5 \times 10^{-4}$ Torr for 7 minutes while flowing oxygen of 12 sccm, and a YSZ layer is allowed to epitaxial-grow by a pulse laser vapor deposition method.

Next, the target is changed to a strontium carbonate target heated at 1000° C. for 2 hours while flowing oxygen under atmospheric pressure, and the layer is kept at 800° C. while flowing oxygen of 6 sccm under a pressure of 10 mTorr and irradiated with laser for 2 minutes to allow a strontium oxide layer to epitaxial-grow on the YSZ layer.

Next, the target is changed to strontium titanate, and the layer is irradiated with laser for 10 minutes under a pressure of 10 mTorr while flowing oxygen to allow a strontium titanate layer to epitaxial-grow on the YSZ layer.

After cooling, the substrate is removed from the chamber. The substrate is placed into a chamber of a sputtering apparatus and kept at 600° C., and platinum is sputtered for 20 minutes while flowing argon of 30 sccm and oxygen of 1 sccm, to form an epitaxial layer of platinum.

After cooling, the substrate is removed from the chamber. 0.3 cc of PLZT sol gel liquid (composition: PLZT 113/3/45/55) is dropped and rotated by a spin coater. The substrate is placed on a hot plate for one minute which has been heated to 350° C. previously to evaporate the solvent, and cooled to room temperature. This operation is repeated three times to completely remove the solvent.

Then, the substrate is heated at 65° C. for 10 minutes under atmospheric pressure while flowing oxygen at 5 L/minute, to crystallize the PLZT layer. A metal mask is placed on the substrate, and a platinum layer in the form of circle is formed on this by a sputtering method.

Further, the substrate is heated at 600° C. for 60 minutes while flowing oxygen at 5 L/minute under atmospheric pressure, to effect recover annealing of the PLZT layer.

A filter element is obtained as described above.

Figure 9:
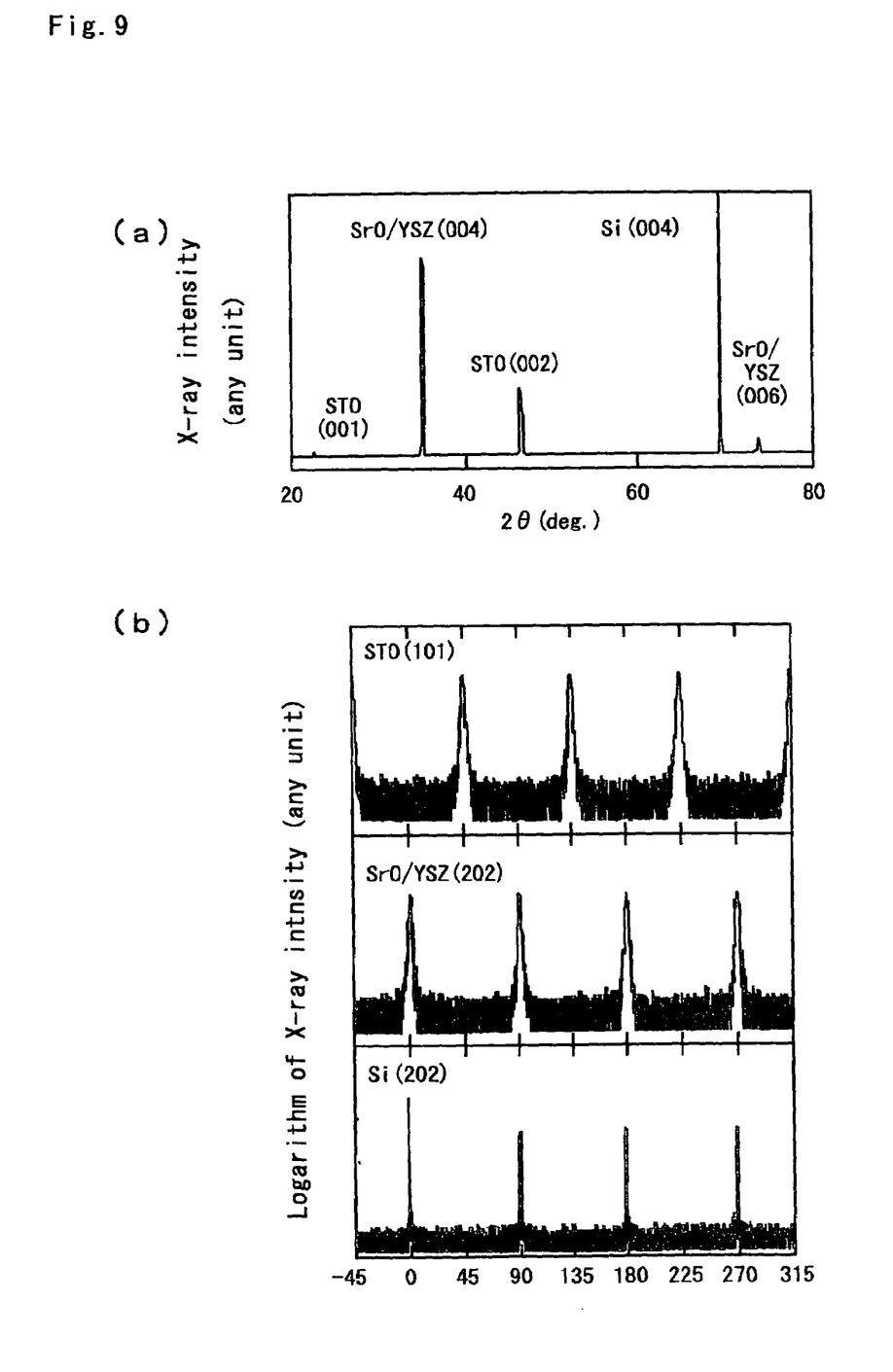
FIG. 9(a) shows a result of an X ray diffraction diagram of the resulted layer and FIG. 9(b) shows a result of φ scan.

The result of an X-ray diffraction diagram of an STO layer having a simple perovskite structure using a silicon single crystal substrate showing the (001) plane on which an epitaxial layer of YSZ has been formed and using a SrO intermediate layer having a rock salt structure is shown in FIG. 9(a), and the φ scan result thereof is shown in FIG. 9(b). The 2θ-θ scan result by an X-ray diffraction method shows orientation of the vertical direction of the substrate, and the φ scan result shows orientation of the in-plane direction of the substrate. In the 2θ-θ scan result in FIG. 9(a), peaks only at {001} of the silicon single crystal and {011} of YSZ, {001} of SrO, and {001} of a perovskite structure are observed. Both YSZ and SrO have a lattice constant of about 0.51 nm, and peaks cannot be separated by an X-ray diffraction method. No observation of diffractions of other index such as {001} and {111} means that all thin layers are in (001) orientation. In the φ scan result in FIG. 9(b), (202) in the plane of silicon, (202) planes of YSZ and SrO, and (101) plane of STO are obtained including four peaks, therefore, they have 4 times symmetry, and all thin layers have epitaxial-grown. The (101) plane of STO shows a shift of peak manifestation angle by 45° against silicon, YSZ and SrO. It shows that the lattice of STO manifests in-plane rotation by 45° against the in-plane of the substrate and grows to the orientation direction of the (001) plane.

Figure 10:
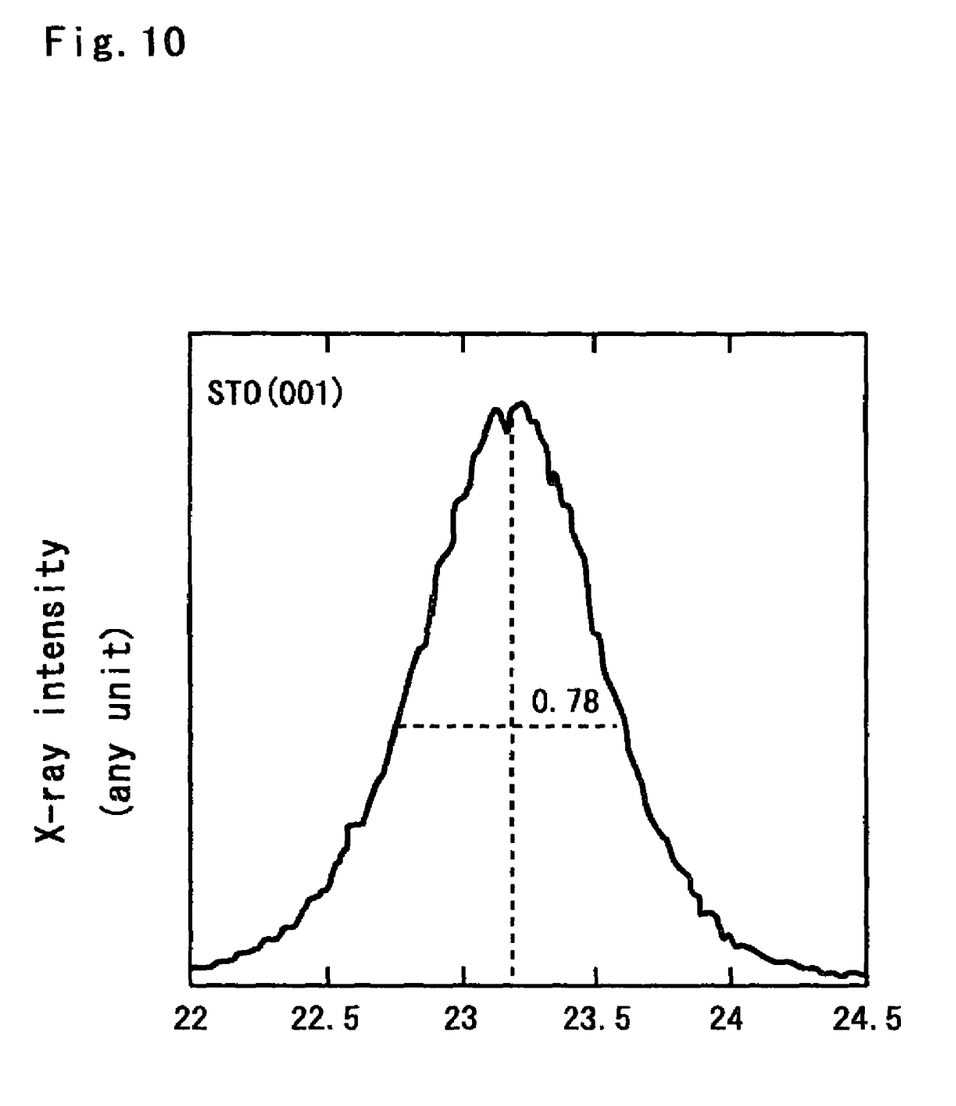
FIG. 10 shows a ω rocking curve of peaks of the (001) plane of an STO epitaxial layer formed directly on a YSZ epitaxial layer oriented to the (001) plane.

FIG. 10 shows a ω rocking curve of peaks of the (001) plane of an STO epitaxial layer formed directly on a YSZ epitaxial layer oriented to the (001) plane. The half breadth is 0.780 lower than 1°, showing a very high crystalline property as a perovskite oxide thin layer formed on a silicon substrate. The reason for this is that a perovskite oxide layer performs in-plane rotation by 45° in a plane against zirconium oxide and grows, as a result, lattice conformity is improved. Therefore, this multi-layer layer laminated on the upper part grows taking over the crystalline property of this layer, teaching that a layer laminated structure composed of layers having good crystalline properties is obtained.

By using the layer laminated structure of the present invention, polarization increases, and a smaller membrane multi-layer structure of high performance and a capacitive element, actuator element and filter element using the same can be provided.

What is claimed is:

1. A membrane multi-layer, comprising:
   a semiconductor substrate having the (001) plane,
   a first thin layer comprising zirconium oxide as a main component formed on or over the semiconductor substrate, having a second (001) plane corresponding to the first (001) plane; and
   a second thin layer, having a simple perovskite structure formed on or over the first thin layer, having a third (001) plane rotated by 45° with respect to the first (001) plane, formed by epitaxial growth.

2. A membrane multi-layer structure, comprising:
   a semiconductor substrate having the (001) plane,
   a first thin layer comprising zirconium oxide as a main component formed on or over the semiconductor substrate, having a second (001) plane corresponding to the first (001) plane; and
   a second thin layer, having a simple perovskite structure formed on or over the first thin layer, having a third (001) plane rotated by 45° with respect to the first (001) plane, formed by epitaxial growth; and
   an intermediate layer formed between the first and the second layer.

3. A membrane multi-layer structure according to claim 1 or 2, wherein the semiconductor substrate is made of silicon.

4. A membrane multi-layer structure according to claim 1 or 2, wherein the first layer comprises alkaline earth metals or light rare earth metals.

5. A membrane multi-layer structure according to claim 1 or 2, further comprising a metal layer comprising one selected from the group consisting of platinum group metal, formed on the second layer by epitaxial growth.

6. A membrane multi-layer structure according to claim 2, wherein the intermediate layer has a crystal structure having a crystal lattice, in which a cation is present at the corner and an anion is present at the center of the edge of the crystal lattice.

7. A membrane multi-layer structure according to claim 2, wherein the intermediate layer has a rock salt structure.

8. A membrane multi-layer structure according to claim 7, wherein the intermediate layer comprises at least one oxide selected from the group consisting of magnesium oxide, calcium oxide, barium oxide and strontium oxide.

9. A membrane multi-layer structure according to claim 1, 2 or 8, wherein the second layer comprises at least one oxide selected from the group consisting of $SrRuO_3$, $CaRuO_3$, $LaNiO_3$, $(La_xSi_{1-x})CoO_3$ (wherein, $0<x<1$), $CaTiO_3$, $(Ba_xSr_{1-x})TiO_3$ (wherein, $0<x<1$).

10. A membrane multi-layer structure according to claim 1, 2 or 8, further comprising a thin layer having a simple perovskite structure on the second layer having a piezoelectric effect or electrostriction effect.

11. A membrane multi-layer structure according to claim 10, wherein the thin layer having a piezoelectric effect or electrostriction effect comprises at least one or more oxides selected from the group consisting of $Pb(Zr_{1-x}Ti_x)O_3$ ($0<x<1$), $(Pb_{1-y}La_y)(Zr_{1-x}Ti_x)O_3$ ($0<x, y<1$), $Pb(B'_{0.33}B''_{0.67})_xTi_yZr_{1-x-y}O_3$ ($0<x, y<1$, B' represents a divalent transition metal and B'' represents a penta-valent transition metal), $Pb(B'_{0.5}B''_{0.5})_xTi_yZr_{1-x-y}O_3$ ($0<x, y<1$, B' represents a tri-valent transition metal and B'' represents a penta-valent transition metal) and $Pb(B'_{0.33}B''_{0.67})_xTi_yZr_{1-x-y}O_3$ ($0<x, y<1$, B' represents a hexa-valent transition metal and B'' represents a tri-valent transition metal).

12. A membrane multi-layer structure according to claim 1, 2 or 8, further comprising a thin layer having a tungsten bronze structure on the second layer.

13. A membrane multi-layer structure according to claim 12, wherein the thin layer having a tungsten bronze structure contains at least one oxide selected from the group consisting of $(Sr_xBa_{1-x})Nb_2O_6$ (wherein, $0<x<1$), $(Sr_{1-x}Ba_x)Ta_2O_6$ (wherein, $0<x<1$), $PbNb_2O_6$, $Ba_2NaNb_5O_{15}$ and $(Ba_xSr_{1-x})TiO_3$ (wherein, $0<x<1$).

14. A membrane multi-layer structure according to claim 1, 2 or 8, further comprising a thin layer having a bismuth layer structure on the second layer.

15. A membrane multi-layer structure according to claim 14, wherein the thin layer having a bismuth layer structure contains at least one oxide selected from the group consisting of $(Bi_{1-x}R_x)_4Ti_3O_{12}$ (wherein, R represents a light rare earth metal including Y and Sc, $0<x<1$), $SrBi_2Ta_2O_9$ and $SrBi_4Ti_4O_{15}$.

16. A membrane multi-layer structure according to claim 1, 2 or 8, further comprising an insulating thin layer between the semiconductor substrate and the first thin layer.

17. A membrane multi-layer structure according to claim 16, wherein the insulating thin layer is a silicon thermal oxidation layer.

18. An actuator element comprising the membrane multi-layer structure according to claim 1 or 2.

19. A capacitive element comprising the membrane multi-layer structure according to claim 1 or 2.

20. A filter element comprising the membrane multi-layer structure according to claim 1 or 2.

* * * * *